United States Patent [19]
Ohsawa et al.

[11] Patent Number: 5,739,851
[45] Date of Patent: Apr. 14, 1998

[54] DRIVING METHOD FOR SOLID STATE IMAGING DEVICE

[75] Inventors: Shinji Ohsawa, Ebina; Yoshiyuki Matsunaga, Kamakura; Nahoko Endo, Sendai, all of Japan

[73] Assignee: Kabushiki Kaisha Toshiba, Kawasaki, Japan

[21] Appl. No.: 526,453

[22] Filed: Sep. 11, 1995

[30] Foreign Application Priority Data

Sep. 14, 1994 [JP] Japan ................................. 6-220100
Aug. 17, 1995 [JP] Japan ................................. 7-209603

[51] Int. Cl.$^6$ ................................................ H04N 5/335
[52] U.S. Cl. ................................. 348/311; 348/248
[58] Field of Search ............................ 348/241, 243, 348/248, 249, 250, 294, 311, 313, 314; 257/229, 230, 232; 250/208.1, 214 R; H04N 5/335

[56] References Cited

U.S. PATENT DOCUMENTS

| | | | |
|---|---|---|---|
| 4,688,098 | 8/1987 | Kon et al. | 348/314 |
| 4,875,101 | 10/1989 | Endo et al. | 348/314 |
| 4,912,560 | 3/1990 | Osawa et al. | 348/314 |
| 5,504,526 | 4/1996 | Miyagawa et al. | 348/313 |

FOREIGN PATENT DOCUMENTS 56-102170  8/1981  Japan.

Primary Examiner—Andrew Faile
Assistant Examiner—Tuan V. Ho
Attorney, Agent, or Firm—Oblon, Spivak, McClelland, Maier, & Neustadt, P.C.

[57] ABSTRACT

A driving method for a solid state imaging device with a horizontal blanking period for each scanning line and a vertical blanking period for each field and including a plurality of cell sections formed in a matrix form on a semiconductor substrate, the plurality of cell sections including a plurality of signal charge storage sections for storing signal charges, a plurality of readout sections for reading out the signal charges from the signal charge storing sections, a plurality of signal charge transferring sections for transferring the readout signal charges, and a plurality of pixel electrodes electrically connected to the plurality of signal charge storage sections, a photoelectric converting layer including at least one photoelectric converting film stacked on the plurality of pixel electrodes, the photoelectric converting film being electrically connected to the electrodes and having a pn junction, and at least one transparent electrode formed on the photoelectric converting film.

12 Claims, 8 Drawing Sheets

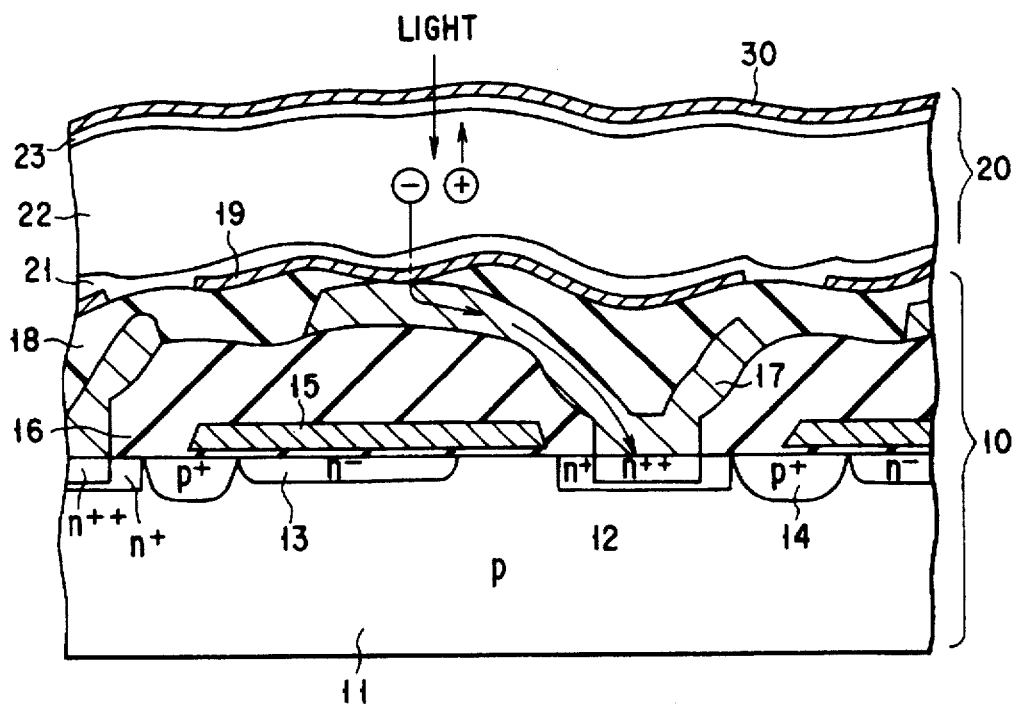
F I G. 1
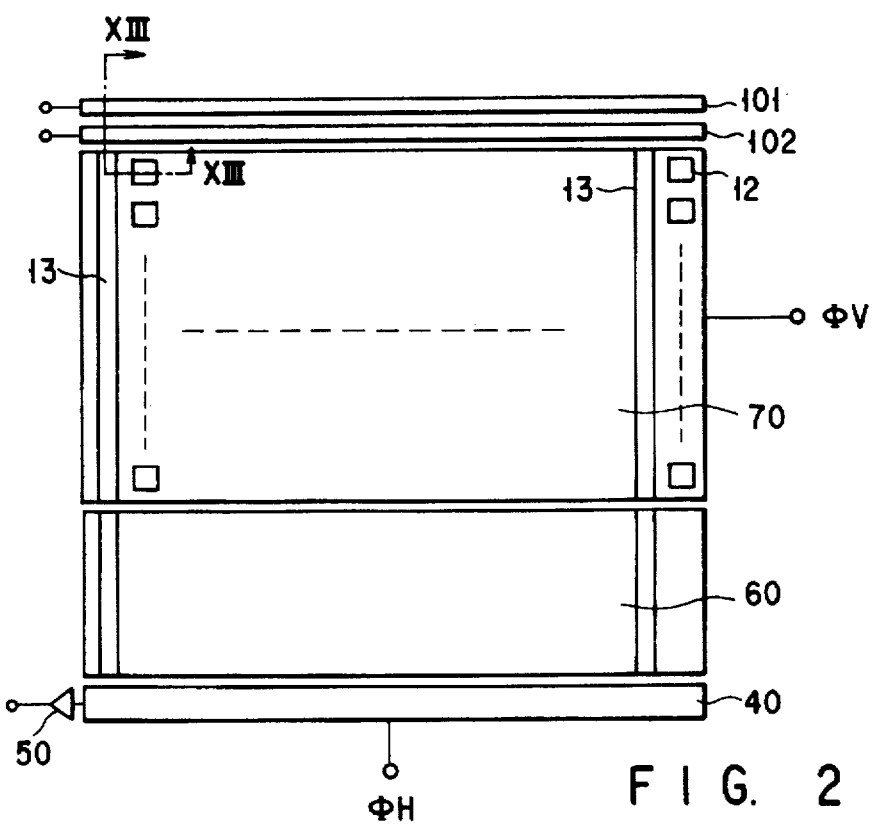
F I G. 2

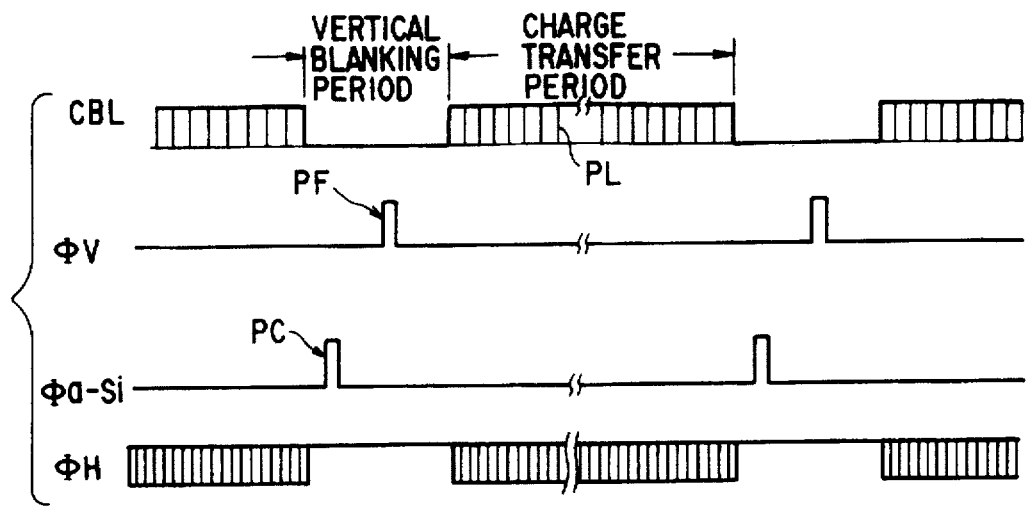
F I G. 5
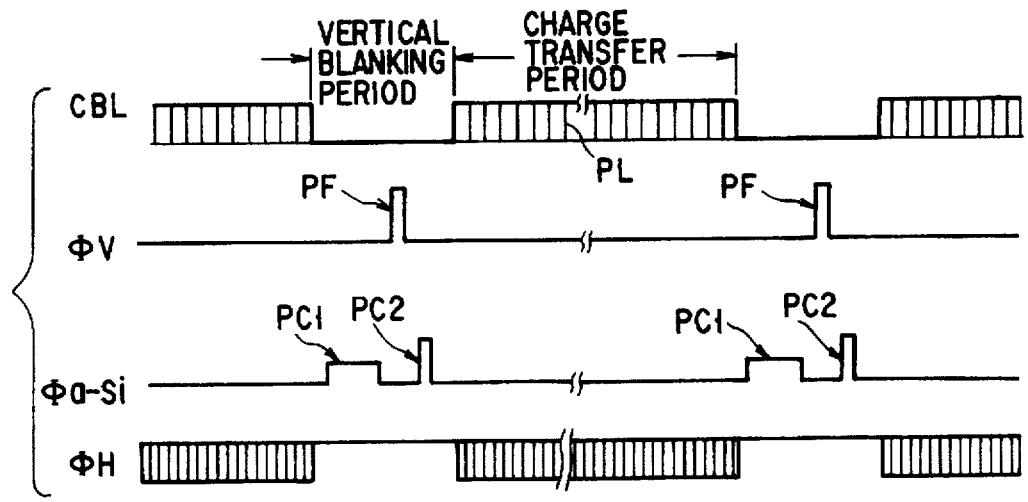
F I G. 6
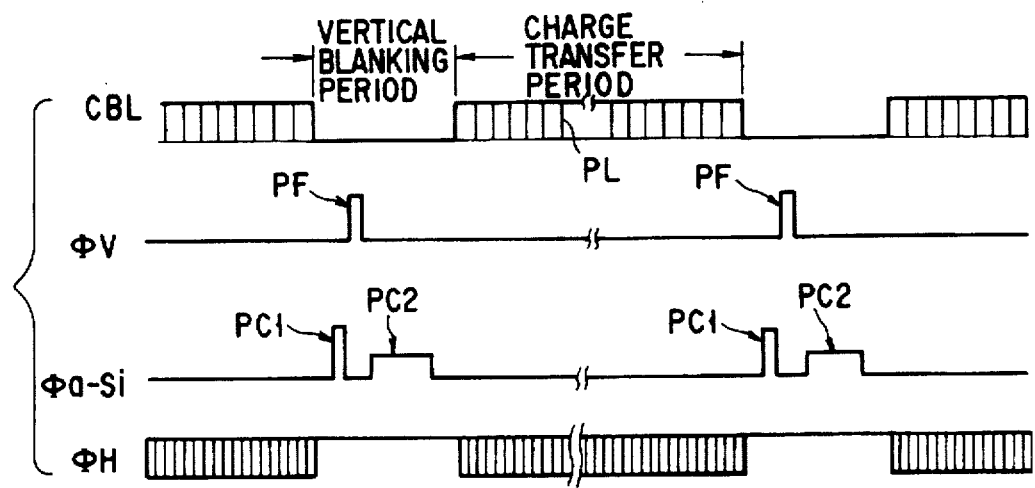
F I G. 7

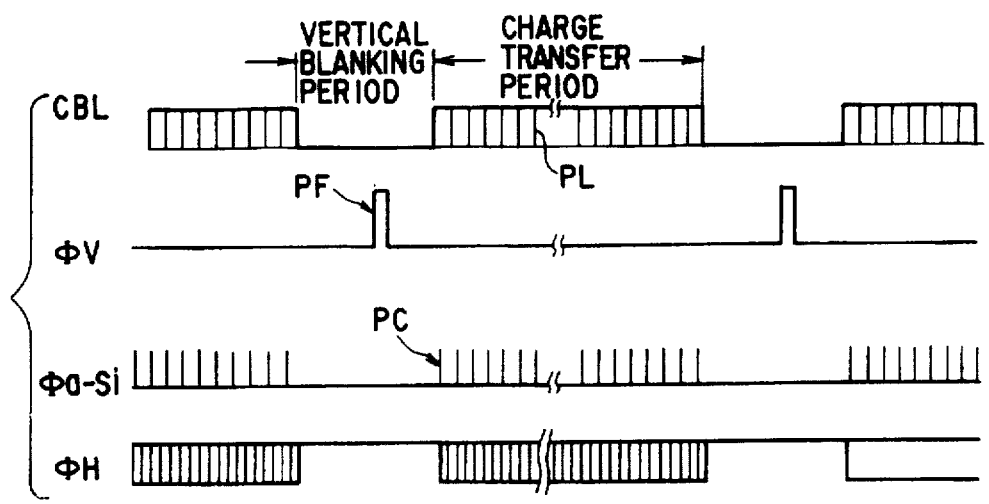
F I G. 8
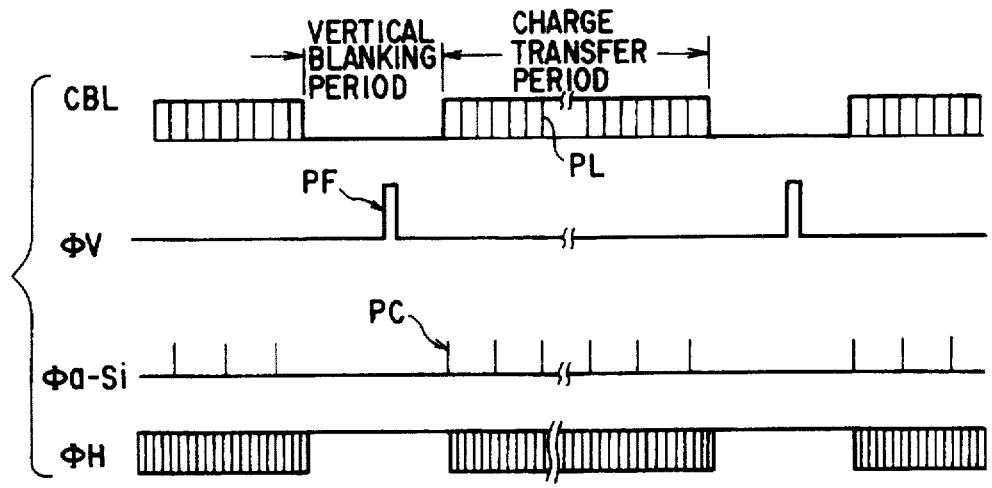
F I G. 9
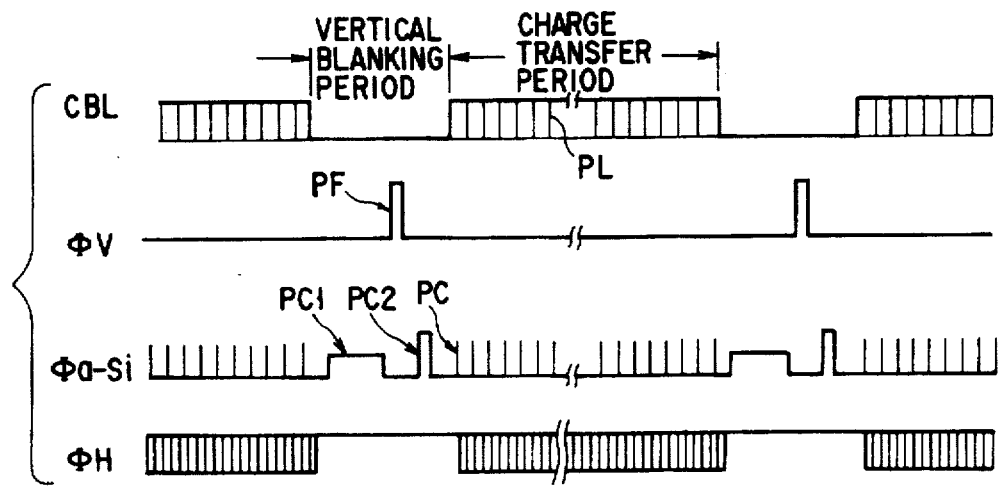
F I G. 10

F I G. 14A 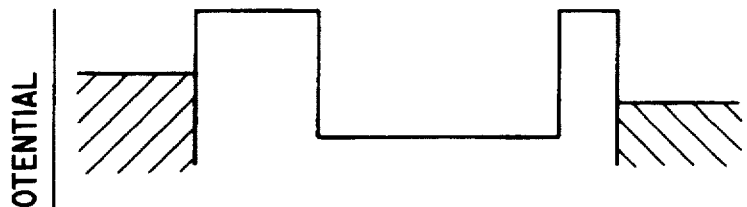
F I G. 14B 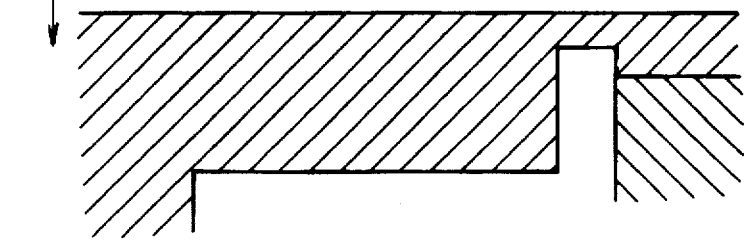
F I G. 14C 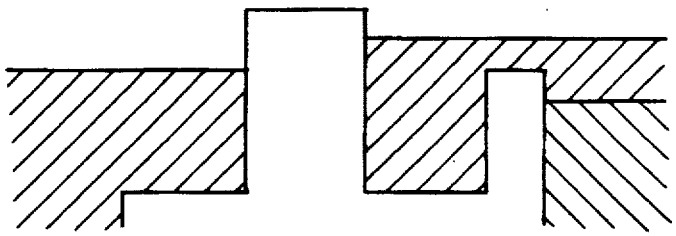
F I G. 14D
F I G. 14E 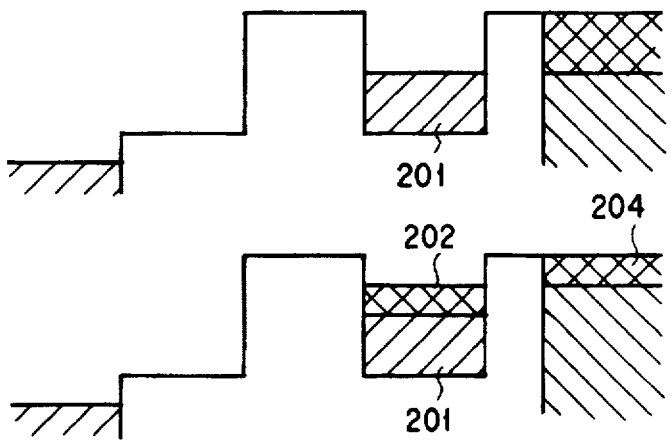

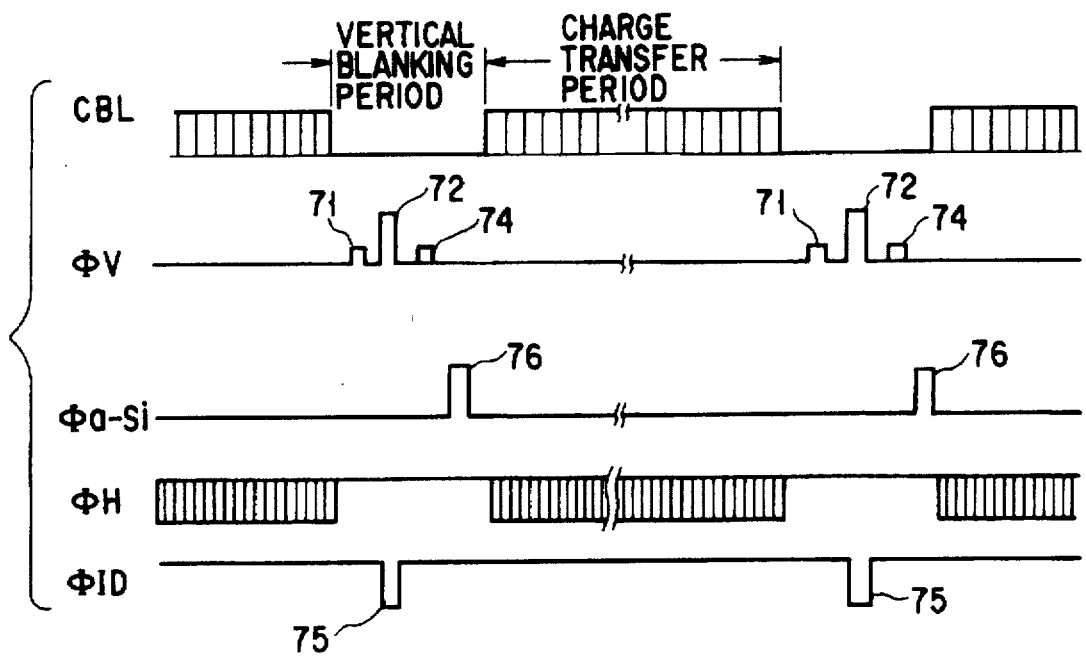
F I G. 16
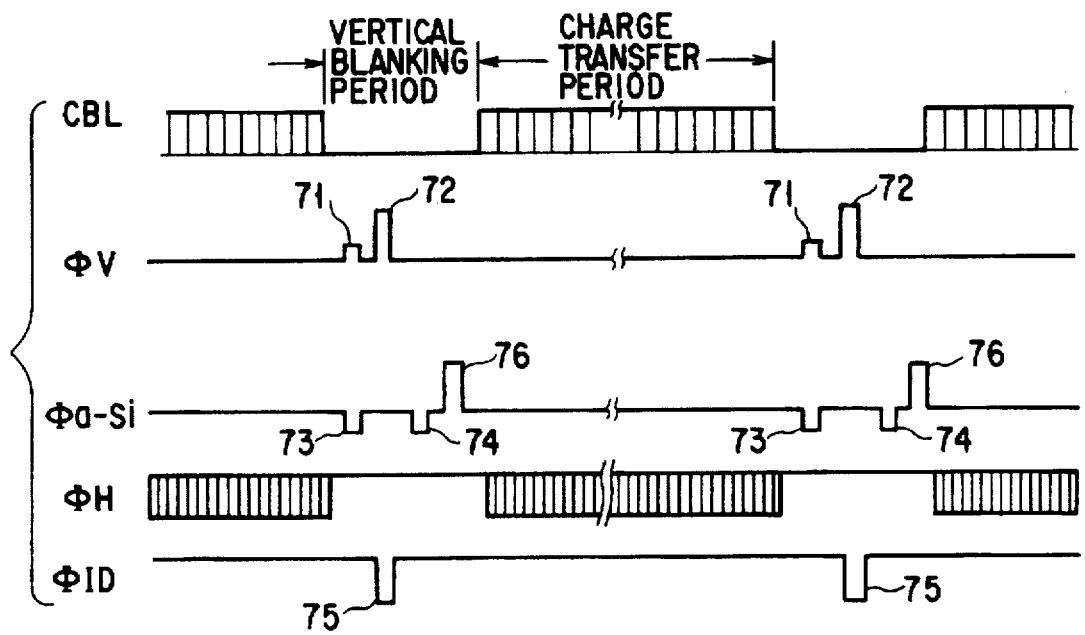
F I G. 17

DRIVING METHOD FOR SOLID STATE IMAGING DEVICE

BACKGROUND OF THE INVENTION

1. Field of the Invention

This invention relates to a driving method for a stack type solid state imaging device having a photoelectric converting film stacked on a solid state imaging device chip, and more particularly to a driving method for a solid state imaging device capable of suppressing a photoconductive afterimage.

2. Description of the Related Art

In recent years, in a solid state imaging device using CCD as a charge transfer section, there occurs a problem that the sensitivity thereof is lowered because of a reduction in the light receiving area for reducing the size of the device or smear increases because a sufficiently large area for separation between the light receiving section and the charge transfer section cannot be taken. Therefore, recently, a stack type solid state imaging device using a conventional solid state imaging device (chip) as a CCD scanning section and having a photoelectric conversion film stacked on the chip is developed. The stack type solid state imaging device is advantageous in miniaturization of the device since the above problem can be solved by using the photoelectric conversion films.

However, this type of device has the following problem. That is, in a case where a hydrogenated amorphous silicon (a-Si:H) film is used as a photoelectric converting film, a photoconductive afterimage caused by the amorphous silicon film becomes a problem. Since the hydrogenated amorphous silicon film has a continuous localized level, carriers generated at the time of application of light are trapped and then thermally excited and made free. This causes a photoconductive afterimage to appear on the reproduced image.

More specifically, conventionally, the photoelectric converting film is driven by DC and a voltage negatively biased against a signal charge storage diode side is applied to the film. Therefore, if carriers generated at the time of application of light are trapped in the localized level and then thermally excited and made free, they flow into the storage diode and are mixed with the signal charge. As a result, an afterimage is created on the reproduced image.

Further, in the photoconductive film stacking type solid state imaging device, there occurs a problem that a capacitive afterimage which deteriorates the image characteristic is made. The capacitive afterimage is made because the signal charge cannot be fully read out when the signal charge stored in the storage diode is read out to the signal scanning section. When an image of high illuminance is changed into an image of low illuminance, charges stored in the storage diode remain and are added to the storage charge for the image of low illuminance so that the image characteristic of the low illuminance portion will be deteriorated. To cope with this phenomenon, a method of making the residual charge constant by injecting bias charges into the storage diode and then resetting the charge is proposed. However, also in this method, the image is deteriorated by the photoconductive afterimage made after resetting the bias charge.

Thus, a photoconductive afterimage caused by the photoconductive film causes a problem in the conventional stack type solid-state imaging device, particularly, in a structure having, for example, a hydrogenated amorphous silicon film stacked as a photoelectric converting film on the CCD scanning section.

SUMMARY OF THE INVENTION

An object of this invention is to provide a driving method for a solid state imaging device which uses a photoelectric converting film of hydrogenated amorphous silicon or the like and which can suppress a photoconductive afterimage.

As a method of suppressing the photoconductive afterimage, a method of improving the photoconductive film itself to reduce the localized level for trapping carriers and a method of improving the device driving method can be considered, for example. In a case of the improvement of the photoelectric converting film itself, it is necessary to reduce only the localized level while maintaining the basic characteristic of the film suitable for the device and it takes a relatively long time to realize the method. This invention intends to suppress the photoconductive afterimage by changing the driving method so as to attain the effect by the improvement in a short period of time.

In order to attain the above object, there is provided a driving method for a solid state imaging device according to a first aspect of this invention with a horizontal blanking period for each scanning line and a vertical blanking period for each field, the imaging device including a plurality of cell sections formed in a matrix form on a semiconductor substrate, the plurality of cell sections including a plurality of signal charge storage sections for storing signal charges, a plurality of readout sections for reading out the signal charges from the signal charge storing sections, a plurality of signal charge transferring sections for transferring the readout signal charges, and a plurality of pixel electrodes electrically connected to the plurality of signal charge storage sections; a photoelectric converting layer including at least one photoelectric converting film stacked on the plurality of pixel electrodes, the photoelectric converting film being electrically connected to the electrodes and having a pn junction; at least one transparent electrode formed on the photoelectric converting film; and an output section for sequentially receiving the transferred signal charges and sequentially outputting the signal charges; comprising the steps of:

storing the signal charges on the signal charge storing sections with a reverse bias applied to the pn junction of the photoelectric converting film;

reading out the stored signal charges to the readout sections in the vertical blanking period; and applying at least one forward bias pulse having a preset amplitude and width to the pn junction of the photoelectric converting film in the vertical blanking period after reading out the signal charges.

A driving method for the above solid state imaging device according to a second aspect of this invention comprises the steps of:

storing the signal charges on the signal charge storing sections with a reverse bias applied to the pn junction of the photoelectric converting film;

reading out the stored signal charges to the readout sections in the horizontal blanking period; and applying at least one forward bias pulse having a preset amplitude and width to the pn junction of the photoelectric converting film in the horizontal blanking period.

In the above driving method, it is preferable to set the amount of holes to be injected into the photoelectric converting film by applying the forward bias to the photoelectric converting film to an amount corresponding to a space charge limited current.

If a plurality of forward bias voltage pulses are applied to the photoelectric converting film in the vertical blanking period, part of the forward bias voltage pulses may be applied before application of the readout pulse and the remaining forward bias voltage pulses may be applied after application of the readout pulse.

The forward bias applied to the photoelectric converting film in the horizontal blanking period may be applied in every horizontal blanking period or may be selectively applied in a desired horizontal blanking period.

The forward bias pulses applied to the photoelectric converting film may be at least two pulses, wherein one is applied in the vertical blanking period and the other is applied in a desired horizontal blanking period.

A driving method for a solid state imaging device according to a third aspect of this invention with a horizontal blanking period for each scanning line and a vertical blanking period for each field and including a plurality of cell sections formed in a matrix form on a semiconductor substrate, the plurality of cell sections including a plurality of signal charge storage sections for storing signal charges, a plurality of readout sections for reading out the signal charges from the signal charge storing sections, a plurality of signal charge transferring sections for transferring the readout signal charges, a plurality of bias charge injection diodes for injecting bias charges into the signal charge storage sections via the signal charge transferring sections, and a plurality of pixel electrodes electrically connected to the plurality of signal charge storage sections; a photoelectric converting layer including at least one photoelectric converting film stacked on the plurality of pixel electrodes, the photoelectric converting film being electrically connected to the electrodes and having a pn junction; at least one transparent electrode formed on the photoelectric converting film; and an output section for sequentially receiving the transferred signal charges and sequentially outputting the signal charges; comprises the steps of:

injecting bias charges from the bias charge injection diodes into the signal charge storage sections via the signal charge transferring sections;

resetting part of the injected bias charges and discharging the same to the signal charge transferring sections and then applying a forward bias pulse to the pn junction of the photoelectric converting film;

storing the signal charges into the signal charge storage sections for a preset period of time; and reading out the stored signal charges together with the bias charges.

Generally, the amorphous silicon film used as the photoelectric converting film is formed by stacking i-type or n-type hydrogenated amorphous silicon carbide (a-SiC:H(i)), i-type hydrogenated amorphous silicon (a-Si:H(i)) and p-type hydrogenated amorphous silicon carbide (a-SiC:H (p)) in this order from the chip side and is considered to have a pn junction. Storage of the signal charges is effected in the reverse bias state in which the potential of the transparent electrode side is kept at a low level.

In this invention, holes of an amount corresponding to a space charge limited current are injected from the transparent electrode by setting the photoelectric converting film into the forward bias state for a preset period of time in a preset cycle in a period in which storage of the signal charges is effected with a reverse bias applied to the photoelectric converting film. The space charge limited current is a current flowing in correspondence to charges stored in a film limited by the capacitance of the film and a voltage applied thereto. That is, since electrons are trapped in the photoelectric converting film, holes of an amount corresponding to the trapped electrons are injected. Then, holes injected from the transparent electrode electrically cancel the electrons which may cause an afterimage, thereby making it possible to suppress the photoconductive afterimage.

Further, in a method of injecting and resetting bias charges in order to suppress the afterimage, it becomes possible to prevent the injected holes from being canceled by electrons which are bias charges by setting the timing for applying the forward bias after the bias charges are injected and then reset and before next signal charges are read out.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a cross sectional view showing the device structure of a stack type solid state imaging device used in each of the embodiments of this invention;

FIG. 2 is a plan view showing the whole structure of a stack type solid state imaging device used in each of the embodiments of this invention;

FIG. 5 is a timing diagram for illustrating a driving method for a stack type solid state imaging device according to a second embodiment of this invention;

FIG. 6 is a timing diagram for illustrating a driving method for a stack type solid state imaging device according to a third embodiment of this invention;

FIG. 7 is a timing diagram for illustrating a driving method for a stack type solid state imaging device according to a fourth embodiment of this invention;

FIG. 8 is a timing diagram for illustrating a driving method for a stack type solid state imaging device according to a fifth embodiment of this invention;

FIG. 9 is a timing diagram for illustrating a driving method for a stack type solid state imaging device according to a sixth embodiment of this invention;

FIG. 10 is a timing diagram for illustrating a driving method for a stack type solid state imaging device according to a seventh embodiment of this invention;

FIGS. 14A to 14I are energy band diagrams for illustrating the bias charge injection effect;

FIG. 16 is a timing diagram for illustrating a driving method for a stack type solid state imaging device according to a tenth embodiment of this invention; and FIG. 17 is a timing diagram for illustrating a driving method for a stack type solid state imaging device according to an eleventh embodiment of this invention.

DETAILED DESCRIPTION OF THE PREFERRED EMBODIMENTS

Figure 3:
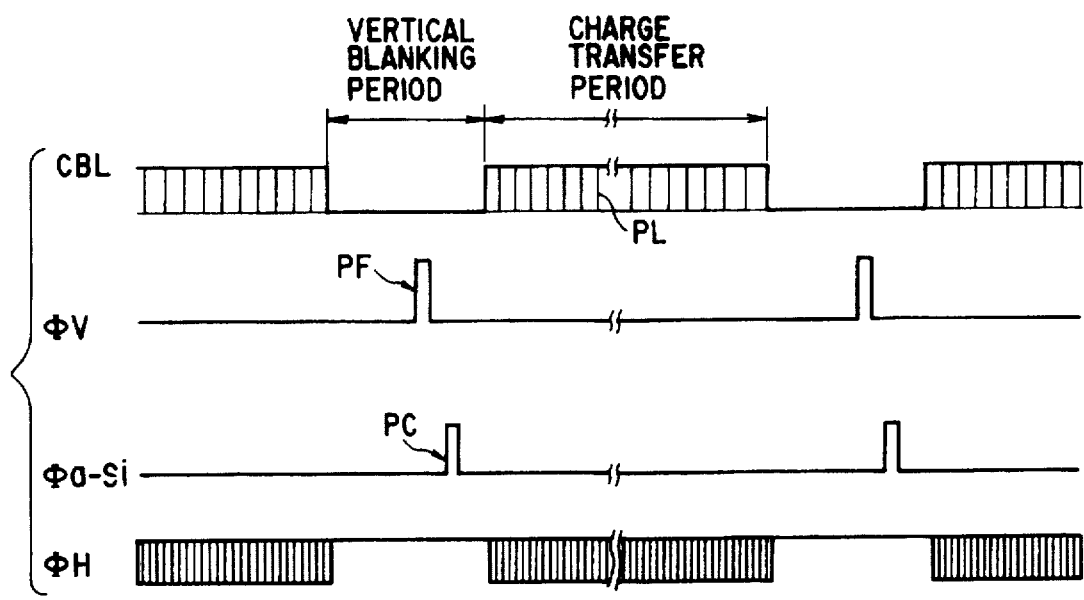
FIG. 3 is a timing diagram for illustrating a driving method for a stack type solid state imaging device according to a first embodiment of this invention.

Before explaining the embodiment of this invention, the basic structure of a stack type solid state imaging device used in each of the embodiments is explained. FIG. 1 is a cross sectional view showing the device structure of the stack type solid state imaging device, and FIG. 2 is a plan view showing the whole structure of the stack type solid state imaging device.

As shown in FIG. 1, a photoelectric converting film 20 is stacked on a solid state imaging device chip 10 and a transparent electrode 30 is formed on the photoelectric converting film 20. The solid state imaging device chip 10 includes an n-type storage diode 12 which is a signal charge storage section formed on the surface of a p-type silicon substrate 11, an n-type CCD channel 13, a p-type element isolating layer 14, a CCD transfer gate 15 insulatively formed on the substrate 11 and also used as a readout electrode, a first inter-level insulative film 16, a lead-out electrode 17, a second inter-level insulative film 18, and a pixel electrode 19. The gate electrode 15 cooperates with an n-type diffusion layer of the storage diode 12 and the n-type CCD channel 13 to construct a MOSFET acting as a signal charge readout section.

The photoelectric converting film 20 is formed by stacking an i-type hydrogenated amorphous silicon carbide (a-SiC:H(i)) film 21, i-type hydrogenated amorphous silicon (a-Si:H(i)) 22 and p-type hydrogenated amorphous silicon carbide (a-SiC:H(p)) 23 in this order from the solid state imaging device chip 10 side. The transparent electrode 30 is formed of ITO (Indium Tin Oxide), for example.

The photoelectric converting film 20 may be divided into a plurality of subfilms, each being stacked on a predivided group of the pixel electrodes. The transparent electrode 30 may also be divided into a plurality of subelectrodes, each being formed on the single photoelectric converting film or one of the subfilms.

As shown in FIG. 2, in a pixel area 70, the storage diodes 12 are arranged in a matrix form and the vertical CCD channel 13 is formed adjacent to the storage diodes 12 to extend in the vertical direction. At one end of the vertical CCD channel 13, a horizontal CCD channel 40 is arranged with a memory section 60 disposed therebetween, and at one end of the horizontal CCD channel 40, an output amplifier 50 is formed. With this arrangement, an imaging device of inter-line transfer system is constructed.

In FIG. 2, a reference numeral 101 denotes an area for forming a plurality of bias charge injection diodes, 102 denotes a plurality of gates forming area, and they are used for injecting bias charges for suppressing the capacitive afterimage as will be described later.

With the above structure, signal charges (electrons) generated in the photoelectric converting film 20 which is set in the electrically reverse bias state are stored into the storage diode 12 via the pixel electrode 19 and lead-out electrode 17.

A signal readout pulse is applied to the transfer electrode 15 to read out the signal charge into the vertical CCD channel 13 and a clock pulse of $\phi V$ is applied to the transfer electrode 15 to transfer the signal charge to the horizontal CCD channel 40. The signal charge is transferred in the horizontal CCD channel 40 in response to a $\phi H$ clock pulse, converted into a voltage by the output amplifier 50 and then output.

There will now be described an embodiment of suppression of the photoconductive afterimage in the above stack type solid state imaging device.

(Embodiment 1)

FIG. 3 is a timing diagram for illustrating a driving method for a stack type solid state imaging device according to a first embodiment of this invention. $\phi V$ indicates the timing of a clock pulse applied to the vertical charge transfer electrode 15 which is partly commonly used as the signal readout electrode, $\phi a$-Si indicates a pulse applied to the transparent electrode 30 on the hydrogenated amorphous silicon film acting as the photoelectric converting film, and $\phi H$ indicates the timing of a clock pulse applied to the charge transfer electrode of the horizontal CCD channel 40. Further, CBL is a chart showing a vertical blanking period and a transfer period of an image of one field and a plurality of horizontal blanking periods PL are contained in the transfer period.

Conventionally, the photoelectric converting section ($\phi a$-Si) was driven by DC such that the hydrogenated amorphous silicon film was set in the reverse bias state with respect to the potential of the signal charge storage diode. When carriers generated at the time of application of light were trapped in the localized level and then thermally excited and made free, the carriers flowed into the storage diode and were mixed with the signal charge. Therefore, the carriers created an afterimage on the reproduced image, thus causing a problem.

In this invention, a pulse is applied to the photoelectric converting section, which was conventionally driven by DC, to drive the same by AC. That is, in the vertical blanking period, a pulse PF for reading out the signal charge from the storage diode 12 is applied to the signal readout electrode 15 to read out the signal charge to the vertical CCD 13, and then a positive pulse (afterimage reducing pulse) PC is applied to the transparent electrode 30 as indicated by $\phi a$-Si in the timing diagram of FIG. 3. As a result, holes injected from the transparent electrode 30 side can electrically cancel charges trapped in the film and causing the afterimage and thus suppress the afterimage.

Figure 4A:
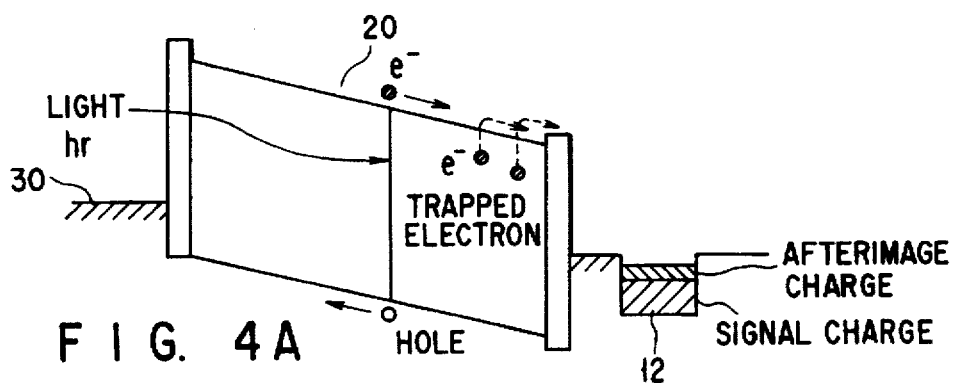
FIGS. 4A and 4B are energy band diagrams for illustrating the mechanism for suppressing the afterimage in the first embodiment, FIG. 4A showing a signal storing period and FIG. 4B showing an afterimage canceling period.

The driving operation is explained with reference to the energy band diagram. FIG. 4A shows a potential relation in the film in the signal storage period. A voltage which is negative with respect to the potential of the storage diode 12 is applied to the transparent electrode 30 so as to set the photoelectric converting film 20 in the reverse bias state. Light is made incident on the photoelectric converting film 20, and electrons generated by photoelectric conversion, that is, the signal charges flow in the film along the electric field and are stored in the storage diode 12. At this time, a small part of the electrons are trapped in the localized level of the film as shown in the drawing, thus causing an afterimage.

Figure 4B:
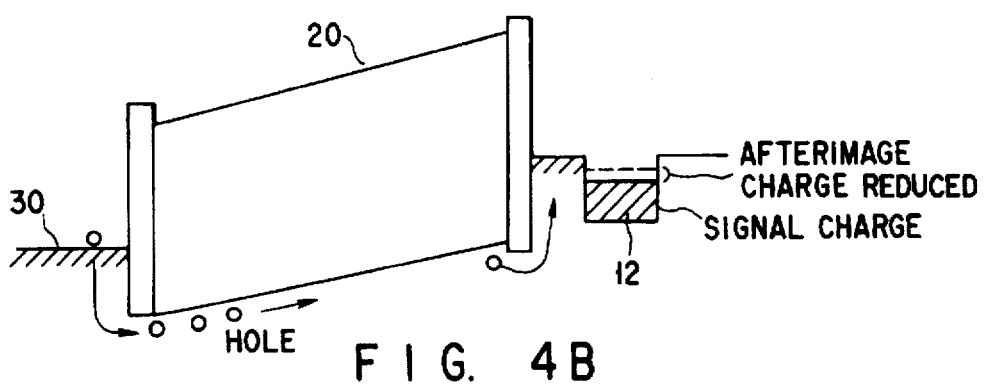

FIG. 4B is a band diagram indicating a state (afterimage reducing period) in which a positive pulse PC is applied to the transparent electrode 30 as indicated by $\phi a$-Si in the timing chart of FIG. 3. A voltage which is positive with respect to the potential of the storage diode 12 is applied to the transparent electrode 30 so as to set the photoelectric converting film 20 in the forward bias state. As a result, holes of an amount corresponding to the amount of electrons trapped in the localized level in the film and causing the afterimage are injected from the transparent electrode 30 side to set an electrically balanced state and thus the electrons are canceled by the holes to suppress the afterimage.

At this time, the amplitude and width of the pulse applied to the photoelectric converting film 20 are determined to meet the condition of the space charge limited current flowing according to the amount of electrons trapped in the film and causing the afterimage. It is not preferable to set a condition that injection of holes of an amount larger than an amount corresponding to the space charge limited current occurs, that is, it is not preferable to set the amplitude to a value larger than necessary or set the pulse width to an excessively large value. The actual values thereof are different depending on the film thickness, film structure and film forming condition of the photoelectric converting film 20. When the device is driven in a condition that injection of an excessively large amount of holes occurs, not only electrons causing the afterimage but also electrons of the signal are resultantly canceled, thereby causing the reproduced image to become dark so as to produce an afterimage on the negative.

The afterimage reducing pulse PC is one pulse in an example of FIG. 3, but a plurality of afterimage reducing pulses may be used. In this case, the amplitudes and widths of the afterimage reducing pulses may be set to the same values or different values.

(Embodiment 2)

FIG. 5 is a timing diagram for illustrating a driving method for a stack type solid state imaging device according to a second embodiment of this invention. In the driving method, a positive pulse PC is inserted as a pulse applied to the transparent electrode 30 (on φa-Si) before the timing of the signal charge readout pulse PF in the vertical blanking period. The principle of cancellation of afterimage is the same as that explained in the first embodiment, but in this case, holes are first stored in the storage diode to cancel electrons which will be transferred later. The condition for the pulse amplitude and pulse width is determined in the same manner as in the first embodiment.

(Embodiment 3)

FIG. 6 is a timing diagram for illustrating a driving method for a stack type solid state imaging device according to a third embodiment of this invention. In the driving method, an afterimage reducing pulse PC1 which is a positive pulse is applied as a pulse applied to the transparent electrode 30 (on φa-Si) before the timing at which the signal readout pulse PF(φV) is applied to the gate electrode in the vertical blanking period and an afterimage reducing pulse PC2 which is a positive pulse is applied after the signal readout pulse PF. The pulse PC1 has a pulse width smaller than and an amplitude larger than those of the pulse PC2, and the pulse PC2 has a pulse width larger than and an amplitude smaller than those of the pulse PC1. Most of the necessary charges can be injected by the pulse PC1 and the amount of injection charges can be finely adjusted by the pulse PC2.

When an object is actually photographed, the brightness is different in different positions in the same image plane and a difference occurs in the afterimage. That is, the density of electrons trapped in the film is different in different positions and the space charge limited current (an amount of injected holes) flowing according to the electrons becomes different in different positions. As is explained in the first embodiment, when the amplitude and pulse width of the afterimage reducing pulse PC are larger than the respective values for causing the space charge limited current, an excessive amount of holes are injected to cancel even electrons of the signal, thereby causing the reproduced image to become dark so as to produce an afterimage on the negative.

On the other hand, by using two types of afterimage reducing pulses (PC1, PC2) as in this embodiment, it becomes possible to set the amplitude and width of the pulses of the afterimage reducing pulse so as to set the amount of holes actually injected into the film to a value corresponding to the space charge limited current. As a result, the driving margin can be increased.

(Embodiment 4)

FIG. 7 is a timing diagram for illustrating a driving method for a stack type solid state imaging device according to a fourth embodiment of this invention. The driving method is attained by changing the order of the pulses PC1 and PC2 applied to the photoelectric converting film 20 in the third embodiment. Also, in this case, the same effect as that in the third embodiment can be attained.

(Embodiment 5)

FIG. 8 is a timing diagram for illustrating a driving method for a stack type solid state imaging device according to a fifth embodiment of this invention. The driving method is effected by inserting a plurality of afterimage reducing pulses PC in synchronism with the timing of the horizontal blanking period PL. All or part of the amplitudes and widths of the plurality of afterimage reducing pulses PC may be set to the same values or all of them may be set to different values.

(Embodiment 6)

FIG. 9 is a timing diagram for illustrating a driving method for a stack type solid state imaging device according to a sixth embodiment of this invention. The driving method is effected by inserting the afterimage reducing pulses PC in synchronism with the timing of a desired horizontal blanking period PL. All or part of the amplitudes and widths of the plurality of afterimage reducing pulses PC may be set to the same values or all of them may be set to different values.

(Embodiment 7)

FIG. 10 is a timing diagram for illustrating a driving method for a stack type solid state imaging device according to a seventh embodiment of this invention. The driving method is effected by inserting the afterimage reducing pulses PC into both of the vertical blanking period and the horizontal blanking period. All or part of the amplitudes and widths of the afterimage reducing pulses PC may be set to the same values or all of them may be set to different values.

FIG. 10 shows a case wherein the third and fifth embodiments are combined, but it is not limited to this example, and it is possible to insert the afterimage reducing pulses PC into both of the vertical blanking period and the horizontal blanking period. For example, one afterimage reducing pulse may be inserted into each vertical blanking period and the afterimage reducing pulse inserted into the horizontal blanking period may not be inserted into each horizontal blanking period but may be inserted into a desired horizontal blanking period.

(Embodiment 8)

Figure 11:
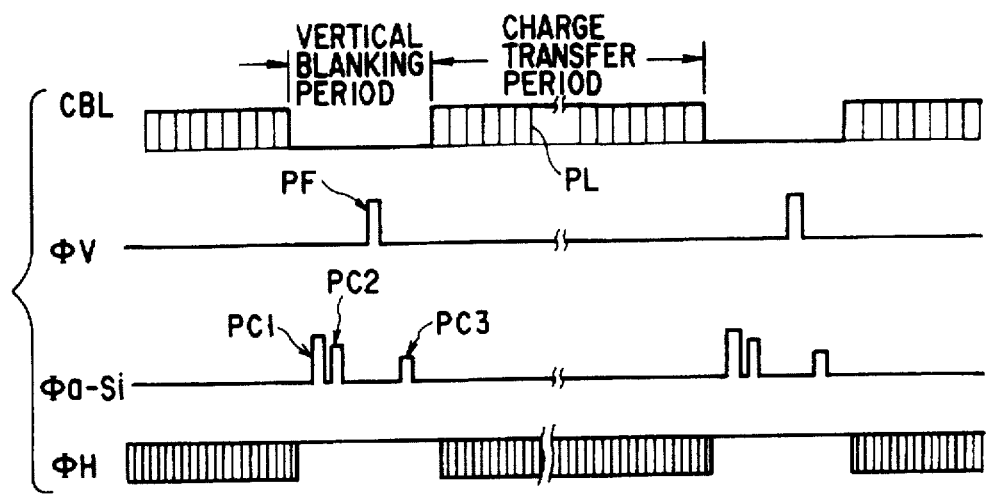
FIG. 11 is a timing diagram for illustrating a driving method for a stack type solid state imaging device according to an eighth embodiment of this invention.

FIG. 11 is a timing diagram for illustrating a driving method for a stack type solid state imaging device according to an eighth embodiment of this invention. The driving method is a driving method in which a plurality of afterimage reducing pulses PC (for example. PC1. PC2, PC3) with different pulse widths are applied as the pulse applied to the transparent electrode 30 (on φa-Si) in the vertical blanking period. The positions in which a plurality of afterimage reducing pulses PC are inserted may be all set before or after the signal readout pulse PF or they may be separately set before and after the signal readout pulse PF.

(Embodiment 9)

Figure 12:
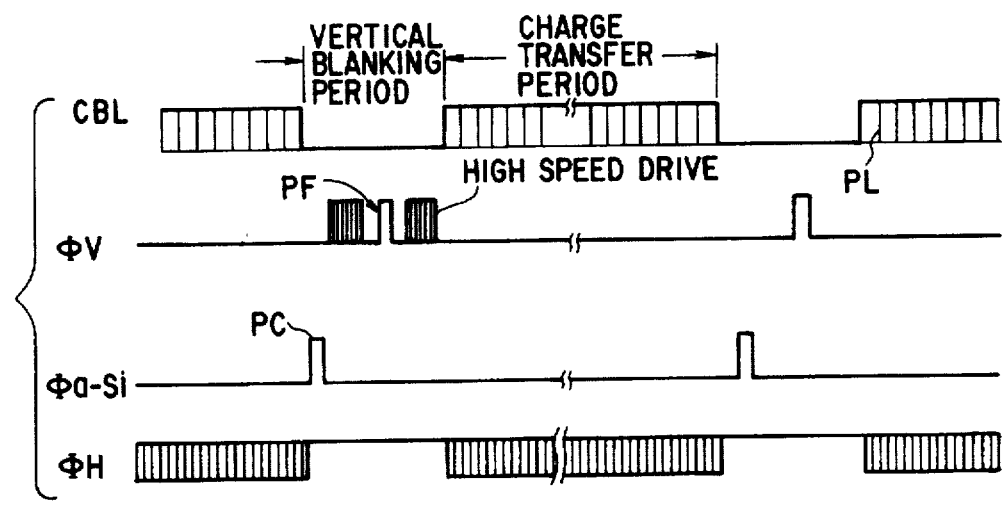
FIG. 12 is a timing diagram for illustrating a driving method for a stack type solid state imaging device according to a ninth embodiment of this invention.

FIG. 12 is a timing diagram for illustrating a driving method for a stack type solid state imaging device according to a ninth embodiment of this invention. The driving method is a driving method in which the timing when the afterimage reducing pulse PC is inserted on the chart φa-Si is correspondingly set in a period in which neither the signal readout pulse PF nor the high-speed driving pulse is present on the chart φV. The high-speed driving pulse is a pulse applied at high speed to discharge the dark current in the channel from the channel, for example.

Next, an example in which this invention is applied to a stack type solid state imaging device of bias charge injection system is explained. Before explaining the embodiment, bias charge injection devised to suppress the capacitive afterimage is explained.

Figure 13:
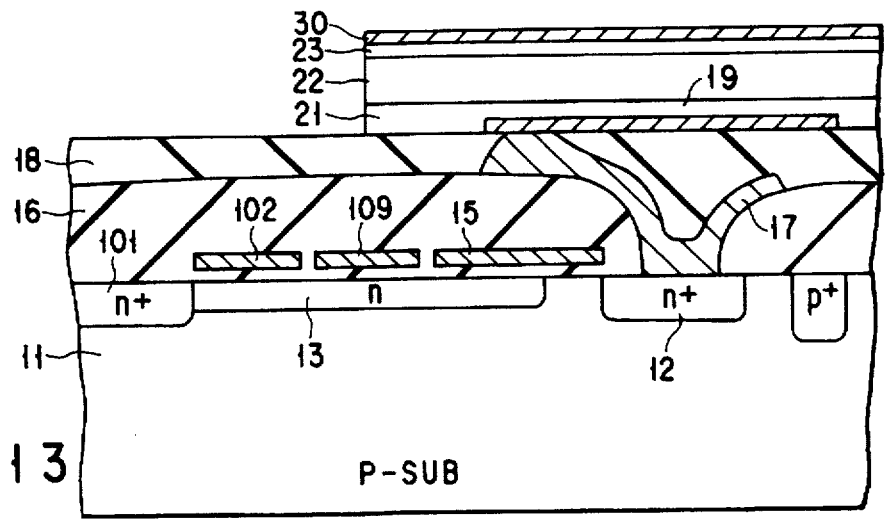
FIG. 13 is a cross sectional view taken along the line XIII—XIII in FIG. 2.

The basic structure of the solid state imaging device is the same as that shown in FIGS. 1 and 2. The operation of injecting and discharging bias charges is explained with reference to FIGS. 13 and 14. FIG. 13 is a cross sectional view taken along the line XIII—XIII of FIG. 2. In the drawing, 101 denotes a bias charge injection diode, 102 denotes a gate, 109 denotes a transfer gate, 15 denotes a readout electrode/transfer gate, and 12 denotes a storage diode. FIG. 14 shows a potential well along line XIII—XIII line of FIG. 2 and the oblique lines indicate that charges are present. In the upper portion of the drawing, reference numerals of corresponding elements are indicated.

First, bias charges are injected into the storage diode 12 via a portion below the transfer gates 109, 15, by opening the gate 102 in the state of FIG. 14A. as shown in FIG. 14B. As shown in FIGS. 14C to 14E, resetting of the bias charge is attained by raising the potential of the injection diode 101 and lowering the potential of the transparent electrode 30 of FIG. 13 after closing the transfer gate 109 and part 202 of the injected bias charge is discharged from the storage diode 12 to under the transfer gate 15. A reference numeral 201 denotes the residual charge remaining under the transfer gate 15. 204 denotes the bias charge remaining after injection into the charge storage section 12.

Figure 14F:
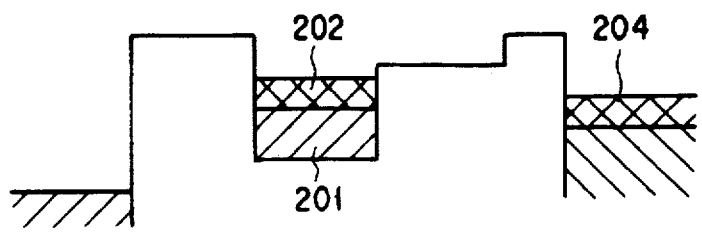
Figure 14G:
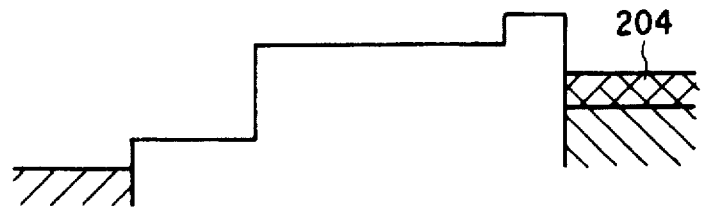
Figure 14H:
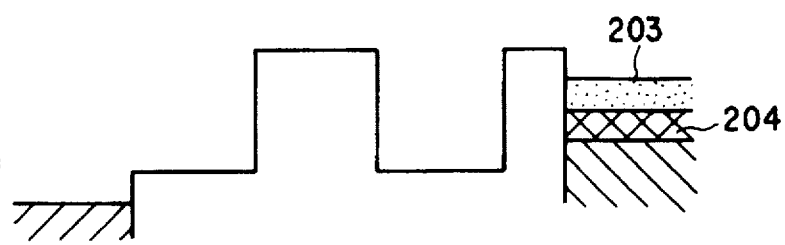
Figure 14I:
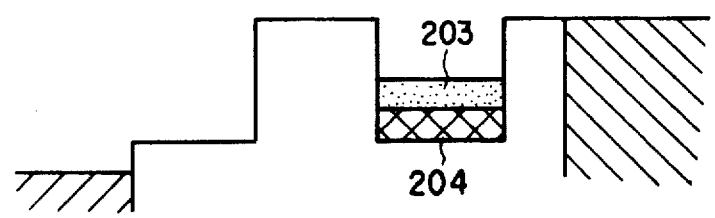

As shown in FIGS. 14F and 14G, the discharged bias charge 202 passes under the transfer gates 15, 109 and the gate 102 and discharged to the diode 101 together with the residual charge 201. After this, as shown in FIGS. 14H and 14I, the signal charge 203 is stored in the charge storage section 12 and then read out and fed to under the transfer gate 110 together with the bias charge 204 remaining in the charge storage section 12. The readout charge is transferred and outputted from the output amplifier 50 of FIG. 2.

The residual charge in the storage diode can be made uniform by the above-described operation of injecting and resetting the bias charge and the capacitive afterimage can be suppressed.

Figure 15:
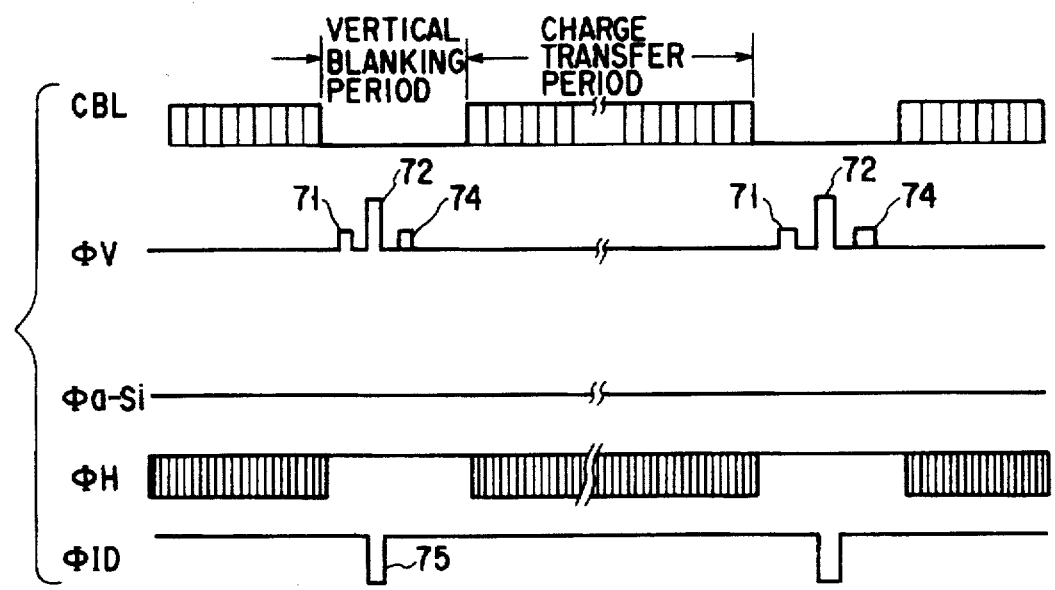
FIG. 15 is a timing diagram for illustrating the conventional driving method in the bias charge injection system.

The conventional driving timing of the stack type solid state imaging device is shown in FIG. 15. φV is a clock pulse applied to the vertical charge transfer electrode which is partly commonly used with the signal readout electrode, φa-Si is a voltage (DC driving) applied to the transparent electrode on the hydrogenated amorphous silicon film as the photoelectric converting film. φID is a pulse input to the injection diode, and φH is a clock pulse applied to the horizontal charge transfer electrode. Further, CBL indicates the vertical blanking period and charge transfer period, and a plurality of horizontal blanking periods are contained in the charge transfer period. A pulse 71 in φV is a readout pulse (corresponding to PF aforementioned), 72 is a bias charge injection pulse, and 74 is a bias charge resetting pulse. A pulse 75 in φID is a bias charge injection pulse.

In FIG. 15, the hydrogenated amorphous silicon film is set in the reverse bias state with respect to the potential of the signal charge storage diode. Therefore, if carriers generated at the time of application of light are trapped in the localized level and thermally excited and made free, they flow into the storage diode and are mixed with the signal charge. Therefore, if the photoconductive afterimage charge occurs after the injection and resetting of the bias charge, an afterimage occurs on the reproduced image, thus causing a problem.

Next, an embodiment in which the photoconductive afterimage is suppressed in the bias charge injection system is explained.

(Embodiment 10)

FIG. 16 is a timing diagram for illustrating a driving method for a stack type solid state imaging device according to a tenth embodiment of this invention. In the drawing, pulses 71, 72, 74, 75 are the same as those of FIG. 15, and a pulse 76 is a forward bias pulse (corresponding to PC aforementioned) applied to the transparent electrode 30.

Injection of the bias charge is completed by applying the bias charge injection pulses 72, 75 after readout of the signal charge by application of the readout pulse 71 and then applying the bias charge reset pulse 74. After this, in this embodiment, the charge causing an afterimage created by the holes injected from the transparent electrode 30 side is canceled by applying the forward bias pulse 76 to the transparent electrode 30 (on φa-Si) and thus the photoconductive afterimage can be suppressed.

In this embodiment, one forward bias pulse 76 is applied after the reset pulse 74 is applied, but two pulses may be applied as in the case of embodiment 3 or 4. Further, as in the case of embodiment 5, it may be applied in each horizontal blanking period, or it may be applied in a desired horizontal blanking period as in the case of embodiment 6. Further, as in the case of embodiment 7, the pulses may be applied in both of the vertical blanking period and horizontal blanking period. Alternatively, the pulse may be applied at the starting portion of a next vertical blanking period before application of a next readout pulse 71.

Thus, the injected holes can be prevented from being canceled by electrons, which are the bias charge, by applying the forward bias pulse to the photoconductive converting film after injection of the bias charge and before readout of the signal charge in the next field. Therefore, in a system in which the operation of injecting and resetting the bias charge is effected in order to suppress the capacitive afterimage, the photoconductive afterimage can be suppressed as in the case of the first to ninth embodiments explained before.

(Embodiment 11)

FIG. 17 is a timing diagram for illustrating a driving method for a stack type solid state imaging device according to an eleventh embodiment of this invention. This is basically the same as the tenth embodiment, but in this embodiment, a readout pulse 73 which is synchronized with the readout pulse 71 is applied to (φa-Si) and the bias charge reset pulse 74 is not applied to φV but is applied to (φa-Si).

With the above construction, substantially the same operation as that of the tenth embodiment can be attained and the same effect as that of the tenth embodiment can be attained.

This invention is not limited to the above embodiments. In the above embodiments, the amorphous silicon is used for forming the photoelectric converting film, but this is not limitative, and various types of semiconductor materials can be used. Further, the structure of the solid state imaging device used in this invention is not limited to the structure shown in FIGS. 1 and 2 and can be adequately changed according to the specification. In addition, this invention can be modified without departing from the technical scope thereof.

As described above, according to this invention, after data is read out in a period of signal charge storage with a reverse bias applied to the photoelectric converting film, holes of an amount corresponding to the space charge limited current can be injected from the transparent electrode side by applying a forward bias to the photoelectric converting film in a preset cycle for a preset period of time, or by applying a forward bias to the photoelectric converting film in a period after injection of the bias charge into the signal storage section and resetting of the bias charge and before readout of the signal charge. Then, charges trapped in the localized level of the film and causing the photoconductive afterimage can be electrically canceled by the injected holes, thereby making it possible to suppress the photoconductive afterimage which has been a serious problem for the stack type solid state imaging device.

Further, in a system in which the operation of injecting and resetting the bias charge is effected in order to suppress the capacitive afterimage, it becomes possible to prevent the injected holes from being canceled by electrons, which are the bias charge, by applying the forward bias pulse to the photoelectric converting film after injection and resetting of the bias charge and before readout of the signal charge and thus the photoconductive afterimage can be suppressed.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A driving method for a solid state imaging device with a horizontal blanking period for each scanning line and a vertical blanking period for each field, the imaging device including a plurality of cell sections formed in a matrix form on a semiconductor substrate, the plurality of cell sections including a plurality of signal charge storage sections for storing signal charges, a plurality of readout sections for reading out the signal charges from the signal charge storing sections, a plurality of signal charge transferring sections for transferring the readout signal charges, and a plurality of pixel electrodes electrically connected to the plurality of signal charge storage sections; a photoelectric converting layer including at least one photoelectric converting film stacked on the plurality of pixel electrodes, the photoelectric converting film being electrically connected to the electrodes and having a pn junction; at least one transparent electrode formed on the photoelectric converting film; and an output section for sequentially receiving the transferred signal charges and sequentially outputting the signal charges; comprising the steps of:

storing the signal charges on the signal charge storing sections with a reverse bias applied to the pn junction of the photoelectric converting film;

reading out the stored signal charges to the readout sections in the vertical blanking period; and applying at least one forward bias pulse having a preset amplitude and width to the pn junction of the photoelectric converting film in the vertical blanking period after reading out the signal charges.

2. A driving method for a solid state imaging device according to claim 1, wherein holes of an amount corresponding to the space charge limited current are injected into the photoelectric converting film by applying the forward bias pulses to the pn junction of the photoelectric converting film.

3. A driving method for a solid state imaging device according to claim 1, wherein said step of applying the forward bias pulses to the pn junction includes a step of applying two pulses having different amplitudes and widths to the pn junction of the photoelectric converting film in the vertical blanking period, one of the two pulses being applied to the pn junction before reading out the signal charges and the other of the two pulses being applied to the pn junction after reading out the signal charges.

4. A driving method for a solid state imaging device according to claim 3, wherein the amplitude of one of the two pulses is smaller than the amplitude of the other of the two pulses and the width of one of the two pulses is larger than the width of the other of the two pulses.

5. A driving method for a solid state imaging device according to claim 3, wherein the amplitude of one of the two pulses is larger than the amplitude of the other of the two pulses and the width of one of the two pulses is smaller than the width of the other of the two pulse.

6. A driving method for a solid state imaging device according to claim 1, wherein said step of applying the forward bias pulses to the pn junction includes a step of applying a plurality of pulses having different amplitudes and widths to the pn junction of the photoelectric converting film in the vertical blanking period, part of the plurality of pulses being applied to the pn junction before reading out the signal charges and remaining ones of the plurality of pulses being applied to the pn junction after reading out the signal charges.

7. A driving method for a solid state imaging device according to claim 1, wherein the photoelectric converting layer include a plurality of photoelectric converting films each stacked on a predivided group of the plurality of pixel electrodes and electrically connected thereto.

8. A driving method for a solid state imaging device with a horizontal blanking period for each scanning line and a vertical blanking period for each field, the imaging device including a plurality of cell sections formed in a matrix form on a semiconductor substrate, the plurality of cell sections including a plurality of signal charge storage sections for storing signal charges, a plurality of readout sections for reading out the signal charges from the signal charge storing sections, a plurality of signal charge transferring sections for transferring the readout signal charges, and a plurality of pixel electrodes electrically connected to the plurality of signal charge storage sections; a photoelectric converting layer including at least one photoelectric converting film stacked on the plurality of pixel electrodes, the photoelectric converting film being electrically connected to the electrodes and having a pn junction; at least one transparent electrode formed on the photoelectric converting film; and an output section for sequentially receiving the transferred signal charges and sequentially outputting the signal charges; comprising the steps of:

storing the signal charges on the signal charge storing sections with a reverse bias applied to the pn junction of the photoelectric converting film;

reading out the stored signal charges to the readout sections in the horizontal blanking period; and applying at least one forward bias pulse having a preset amplitude and width to the pn junction of the photoelectric converting film in the horizontal blanking period.

9. A driving method for a solid state imaging device according to claim 8, wherein holes of an amount corresponding to the space charge limited current are injected into the photoelectric converting film by applying the forward bias pulses to the pn junction of the photoelectric converting film.

10. A driving method for a solid state imaging device according to claim 8, wherein said step of applying the forward bias pulse to the pn junction includes a step of applying at least one pulse having a preset amplitude and width to the pn junction of the photoelectric converting film in the horizontal blanking period.

11. A driving method for a solid state imaging device according to claim 8, wherein said step of applying the forward bias pulse to the pn junction includes a step of applying at least one pulse having a preset amplitude and width to the pn junction of the photoelectric converting film in a desired horizontal blanking period.

12. A driving method for a solid state imaging device according to claim 8, wherein said step of applying the forward bias pulse to the pn junction includes a step of applying at least one pulse having a preset amplitude and width to the pn junction of the photoelectric converting film after reading the signal charge in the vertical blanking period and in the horizontal blanking period.

* * * * *